United States Patent
Ming et al.

(10) Patent No.: US 12,096,664 B2
(45) Date of Patent: Sep. 17, 2024

(54) TFT ARRAY SUBSTRATE AND DISPLAY PANEL

(71) Applicant: Wuhan China Star Optoelectronics Semiconductor Display Technology Co., Ltd., Wuhan (CN)

(72) Inventors: Xing Ming, Wuhan (CN); Zhongtao Cao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 94 days.

(21) Appl. No.: 17/262,752

(22) PCT Filed: Nov. 18, 2019

(86) PCT No.: PCT/CN2019/119059
§ 371 (c)(1),
(2) Date: Jan. 25, 2021

(87) PCT Pub. No.: WO2021/027169
PCT Pub. Date: Feb. 18, 2021

(65) Prior Publication Data
US 2022/0199719 A1 Jun. 23, 2022

(30) Foreign Application Priority Data

Aug. 12, 2019 (CN) .......................... 201910737838.1

(51) Int. Cl.
*H10K 59/124* (2023.01)
*H10K 102/00* (2023.01)

(52) U.S. Cl.
CPC ..... *H10K 59/124* (2023.02); *H10K 2102/311* (2023.02)

(58) Field of Classification Search
CPC ............... H01L 27/1244; H01L 27/124; H01L 27/1248; H10K 2102/311; H10K 77/111; H10K 59/131
See application file for complete search history.

(56) References Cited

U.S. PATENT DOCUMENTS

2014/0097408 A1 4/2014 Kim et al.
2018/0013095 A1* 1/2018 Choi .................... H10K 50/844
(Continued)

FOREIGN PATENT DOCUMENTS

CN 108695343 A 10/2018
CN 109378318 A 2/2019
(Continued)

*Primary Examiner* — Michelle Mandala
*Assistant Examiner* — Jordan M Klein
(74) *Attorney, Agent, or Firm* — Nathan & Associates; Menachem Nathan

(57) ABSTRACT

The disclosure provides a thin film transistor (TFT) array substrate provided with a display area and a bending area, including a substrate layer and a functional layer disposed on the substrate layer, wherein the functional layer includes a plurality of insulating layers and a plurality of metal layers. In the bending area, the metal layers include a first metal layer, a second metal layer, and a second gate layer. The first metal layer is disposed on a side end of a filling layer and connects to the second gate layer by a through hole. The second metal layer is disposed on an insulating layer on an outer side of the first metal layer.

8 Claims, 7 Drawing Sheets

(56) References Cited

U.S. PATENT DOCUMENTS

| | | | | |
|---|---|---|---|---|
| 2018/0366586 A1* | 12/2018 | Son | ................... | H01L 27/1255 |
| 2019/0164995 A1* | 5/2019 | Lee | ................... | H10K 77/111 |
| 2019/0189722 A1* | 6/2019 | Lim | ................... | H10K 77/111 |
| 2020/0161569 A1* | 5/2020 | Yu | ................... | H10K 59/122 |
| 2020/0203640 A1* | 6/2020 | Yang | ................... | H10K 71/00 |
| 2020/0235135 A1* | 7/2020 | Yang | ................... | H01L 27/1248 |
| 2021/0057510 A1* | 2/2021 | Watanabe | ................... | H05B 33/04 |
| 2021/0367169 A1* | 11/2021 | Wu | ................... | H10K 59/1213 |
| 2023/0102637 A1* | 3/2023 | Ming | ................... | H10K 59/123 |
| | | | | 257/72 |

FOREIGN PATENT DOCUMENTS

| | | |
|---|---|---|
| CN | 109585511 A | 4/2019 |
| CN | 109887956 A | 6/2019 |

\* cited by examiner

TFT ARRAY SUBSTRATE AND DISPLAY PANEL

FIELD

The present disclosure relates to the field of flat display technologies and, more particularly, relates to a thin film transistor (TFT) array substrate and a display panel.

BACKGROUND

With continuous development of display technologies, flat display panels have gradually become mainstream of display devices. Among them, organic light-emitting diode (OLED) display panels in industry gradually replace liquid crystal display (LCD) panels and have become next-generation display panels because of their advantages such as lightweight, self-luminescence, wide viewing angles, low driving voltage, high luminescence efficiency, low power consumption, and fast response times.

Furthermore, in addition to the above advantages, OLED display panels have another extremely important property: bendability. Bendability brings a unique advantage to OLED devices in terms of portability and therefore has become a focus of research and development in the industry.

Take flexible and bendable active-matrix organic light-emitting diodes (AMOLEDs) as an example. A low temperature polysilicon (LTPS) process applied thereto generally contains ten to fifteen steps. Compared with rigid AMOLEDs, flexible AMOLEDs need two to three more steps in a process for forming masks. Because in flexible AMOLEDs, a periphery of a bending area in a non-display area has low stress resistance and bad flexibility, those two to three more steps are to define two deep holes in a non-organic thin-film functional layer by lithography and dry etching, and the deep holes extend from top to bottom of the non-organic thin-film functional layer. Then, an organic polyimide material with good flexibility is filled in the deep holes to form a filling layer, thereby improving bendability of the flexible AMOLEDs.

As shown in FIG. 5 and FIG. 6, schematic structural views of a thin film transistor (TFT) array substrate applied to conventional flexible AMOLEDs are shown. In FIG. 5 and FIG. 6, the TFT array substrate defines a display area 100' and a bending area 110'. Typically, a TFT device functional layer is disposed in the display area 100', and a metal layer, which is configured to form multiple data lines and multiple Vdd lines, is disposed in the bending area 110'. The data lines are generally implemented by a first metal layer 104' configured to form a source/drain in the display area 100', and the Vdd lines are generally implemented by a second metal layer 106'.

According to a usual practice of the LTPS process in the industry, referring to FIG. 5 to FIG. 8, in the bending area 110' at a periphery of a display panel, the filling layer 102' made of the organic polyimide material forms two symmetrically disposed side ends covering a portion of a top periphery of the first deep hole, as shown in a position 130' in FIG. 5 and FIG. 7. The first metal layer 104' may remain on a periphery of the filling layer 102', thereby resulting in a short circuit. To prevent the above situation, the most popular method is disposing a transit position of the first metal layer 104', which is configured to form data lines in the bending area 110', on a covering area of the side end of the filling layer 102', wherein only one filling hole is defined in the transit position.

However, there is a problem in the above structure. As shown in the position 130' in FIG. 7, a middle portion of the position 130' protrudes because two sides of the filling layer 102' are provided with an opening, resulting in not only difficulty in releasing bending forces, but also risks of breakage of lines when the first metal layer 104' is etched in a subsequent process. Specifically, the middle portion of the position 130' is a position 150' circled in FIG. 8.

Consequently, it is necessary to develop a novel TFT array substrate to overcome defects in the conventional technology.

SUMMARY

One aspect of the present disclosure is to provide a TFT array substrate. A bending area of the TFT array substrate has a new structure of a metal line layer, which prevents a first metal layer from passing between two openings of a filling layer in the bending area, thereby effectively reducing risks of breakage of lines because of over etch.

Technical solutions provided by the present disclosure are described as follows.

A TFT array substrate, provided with a display area and a bending area, including a substrate layer and a functional layer disposed on the substrate layer, wherein the functional layer includes a plurality of insulating layers and a plurality of metal layers. wherein a deep hole is defined in the functional layer in the display area, a filling layer is disposed in the deep hole, and a side end at top of the filling layer protrudes from a periphery of the deep hole. In the bending area, the metal layers include a first metal layer, a second metal layer, and a second gate layer, and the insulating layers of the functional layer are disposed between the second gate layer, the first metal layer, and the second metal layer. The first metal layer is disposed on the side end of the filling layer and is connected to the second gate layer by a through hole, and the second metal layer is disposed on an insulating layer on an outer side the first metal layer.

Furthermore, in other embodiments, the metal layer in the bending area includes a first gate layer, a gate insulating layer is disposed between the first gate layer and the second gate layer, and the insulating layer disposed between the second gate layer and the first metal layer is an interlayer dielectric layer. In other embodiments, the interlayer dielectric layer can be a double-stacked structure including a first interlayer dielectric layer and a second interlayer dielectric layer. Typically, the insulating layer disposed between the second gate layer and the first metal layer is the second interlayer dielectric layer, but is not limited thereto.

Furthermore, in other embodiments, the insulating layer disposed between the first metal layer and the second metal layer is a first planarization layer, and the side end of the filling layer covers a portion of the interlayer dielectric layer.

Furthermore, in other embodiments, the second metal layer is connected to the first gate layer by the through hole.

Furthermore, in other embodiments, a transfer metal layer is disposed between the second metal layer and the first gate layer, the second metal layer is connected to the transfer metal layer by the through hole, and the transfer metal layer is connected to the first gate layer by the through hole. Preferably, the transfer metal layer is formed from the first metal layer that is patterned.

Furthermore, in other embodiments, the functional layer in the bending area includes a buffer layer, the buffer layer is disposed on the substrate layer, and the filling layer penetrates the buffer layer and reaches the substrate layer.

Furthermore, in other embodiments, the substrate layer includes a polyimide layer and a barrier layer disposed on the polyimide layer, and a bottom of the filling layer penetrates the barrier layer and reaches a surface of the polyimide layer.

Furthermore, in other embodiments, in the bending area, an insulating layer disposed between the first metal layer and the second metal layer is a first planarization layer, and a second planarization layer covers the second metal layer.

Furthermore, another aspect of the present disclosure provides a display panel, including the above TFT array substrate.

Furthermore, in other embodiments, the display panel is a flexible active-matrix organic light-emitting diode (AMO-LED) display panel.

Regarding the beneficial effects: the present disclosure relates to a TFT array substrate having a novel structure of lines in a bending area. In the bending area, lines on a first metal layer are disposed on a position where lines of the second metal layer are originally disposed, and a position where the lines on the first metal layer are originally disposed is filled with a first planarization layer. Therefore, the lines of the first metal layer do not pass between two openings of a filling layer, and a problem that lines are prone to breakage is prevented.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Technical solutions of a TFT array substrate and a display panel provided by the present invention are further described below in conjunction with accompanying drawings and embodiments.

Figure 1:
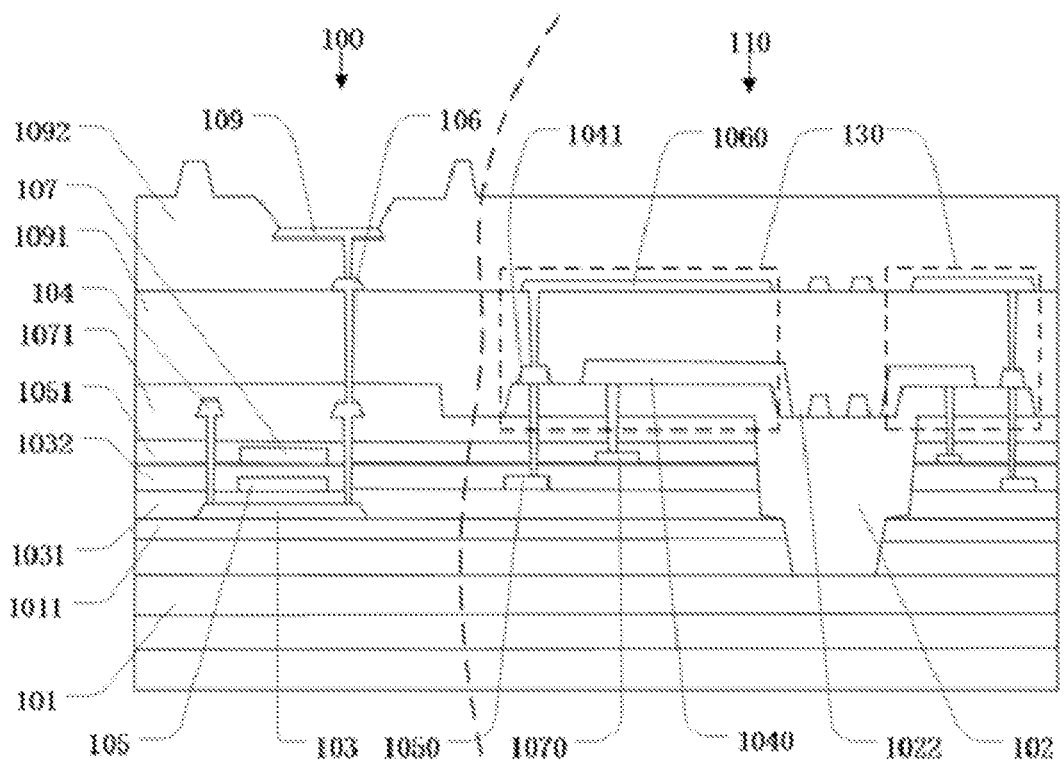
FIG. 1 is a sectional structural view showing a TFT array substrate provided by an embodiment of the present disclosure.
Figure 2:
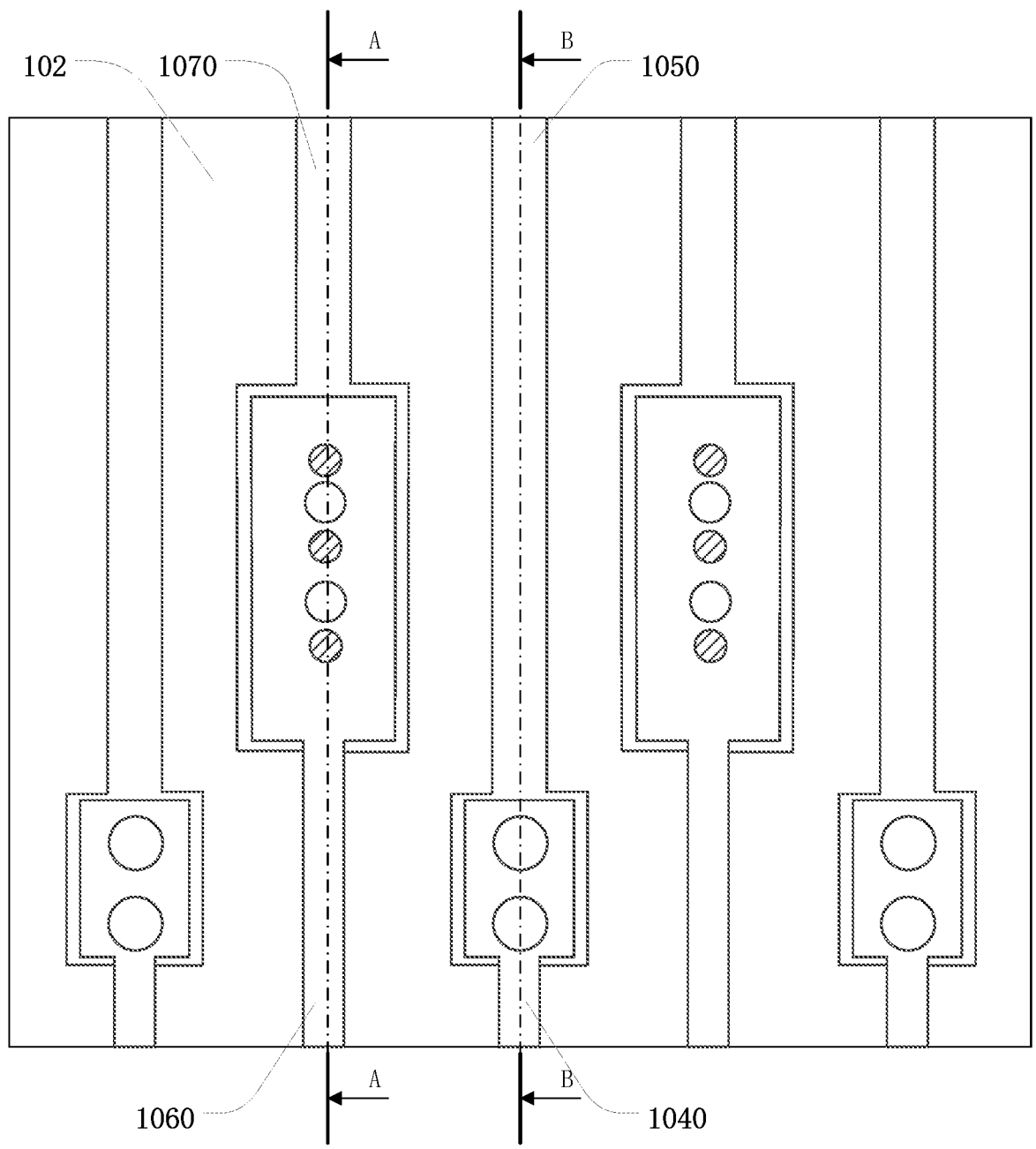
FIG. 2 is a structural plan view showing a bending area of the TFT array substrate in FIG. 1.
Figure 3:
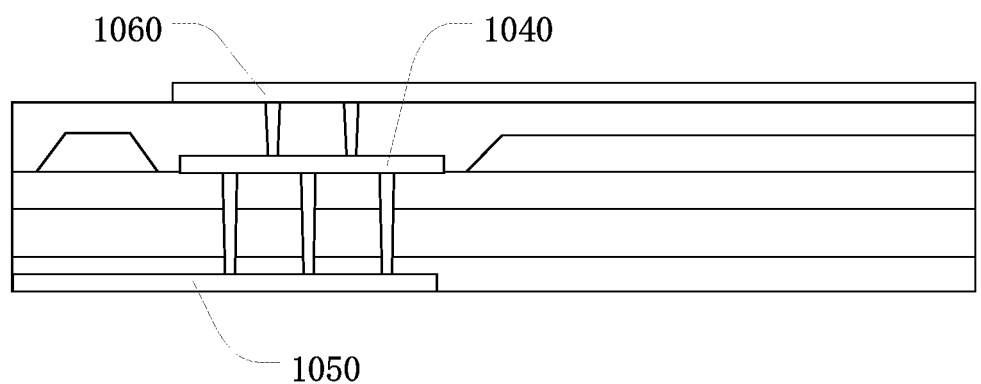
FIG. 3 is a sectional view taken along line A-A in FIG. 2.
Figure 4:
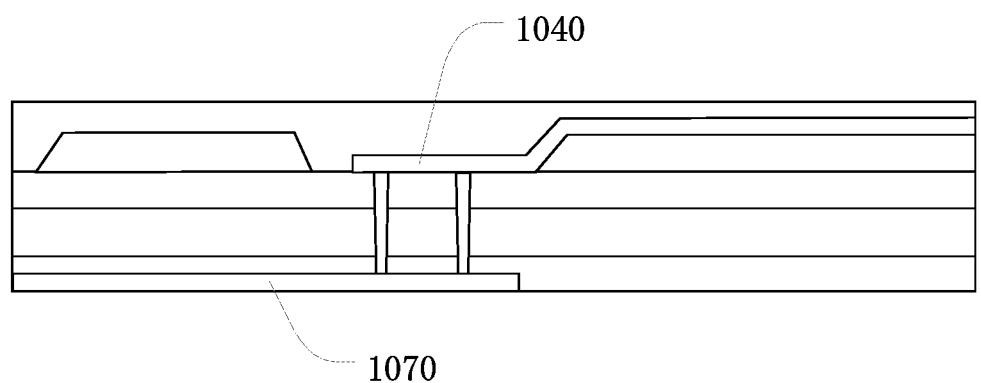
FIG. 4 is a sectional view taken along line B-B in FIG. 2.

Refer to FIG. 1. An embodiment of the present disclosure provides a TFT array substrate defined with a display area 100 and a bending area 110.

The TFT array substrate includes a substrate layer 101 having two polyimide substrates, namely a polyimide layer and a barrier layer; however, a structure of the substrate layer 101 is not limited thereto. A buffer layer 1011 is disposed on the substrate layer 101.

In the display area 100, the buffer layer 1011 includes a TFT device functional layer including a plurality of metal layers and a plurality of insulating layers. The metal layers include an active layer 103, a first gate layer 105, a second gate layer 107, and a first metal layer 104 which is configured to form a source/drain layer. The insulating layers are disposed between different metal layers. Specifically, the insulating layers include a first gate insulating layer 1031, a second gate insulating layer 1032, a first interlayer dielectric layer 1051, and a second interlayer dielectric layer 1071. The above metal layers and insulating layers may be a single-layer structure or a stacked-layer structure according to requirements. A passivation layer may be further disposed on the first metal layer 104 to prevent moisture from entering the first metal layer 104, thereby solving a problem of short lifetime because of moisture erosion.

Furthermore, a first planarization layer 1091 and a second planarization layer 1092 are further disposed on the second interlayer dielectric layer 1071, and a second metal layer 106 and an anode metal layer 109 are disposed within the above two planarization layers. The second metal layer 106 and the anode metal layer 109 are connected by a through hole, and the second metal layer 106 and the first metal layer 104 are connected by the through hole.

However, a structure in the bending area 110 is different from a structure in the display area 100 because its bending function needs to be realized. A filling layer 102 disposed on the buffer layer 1011 disposed on the substrate layer 101 is filled with an organic material. Specifically, the filling layer 102 is filled with an organic polyimide material, thereby improving bendability in a position where the filling layer 102 is disposed.

Furthermore, in the bending area 110, the filling layer 102 penetrates the second interlayer dielectric layer 1071, the first interlayer dielectric layer 1051, the second gate insulating layer 1032, and the first gate insulating layer 1031 and extends to the substrate layer 101. Specifically, the filling layer 102 penetrates the barrier layer in the substrate layer 101 and reaches a surface of the polyimide layer of the substrate layer 101. However, the present disclosure is not limited thereto.

Furthermore, the filling layer 102 is formed by filling a deep hole, but is not limited thereto. A top opening 1022 is formed on a surface of the deep hole, and two symmetrically disposed side ends 1021 protrude from a periphery of the deep hole and cover the interlayer dielectric layer. The side ends 1021 are disposed on the second interlayer dielectric layer 1071. The side ends 1021 and the top opening 1022 may be planarized by the first planarization layer 1091.

Furthermore, metal layers configured to form data lines or Vdd lines are also disposed in the bending area. The metal layers include a first gate layer, a second gate layer, a first metal layer, and a second metal layer. Specifically, positional relationships of the lines between the above metal layers are respectively described below. Furthermore, in the bending area 110, a positional relationship between the first metal layer and the second metal layer is also a focal point of the present disclosure and is illustrated below in conjunction with accompanying drawings.

In the bending area, a first metal layer 1040 of the first metal layer is generally configured to form data lines. In the present disclosure, to overcome a problem that lines are prone to breakage, a transposition design is applied in the present disclosure. Specifically, a position of lines on the first metal layer and a position of lines on the second metal layer are exchanged.

Refer to FIG. 1 to FIG. 4. In the bending area, a first metal layer 1040 is disposed on one of the side ends 1021 of the filling layer 102. The first metal layer 1040 extends into the top opening 1022 of the filling layer 102 and electrically connects to a second gate layer 1070 in the bending area by the through hole. A second metal layer 1060 is disposed on an outer side of the first metal layer 1040 in the bending area and electrically connects to the first gate layer 1050 by a transfer first metal layer 1041 in the bending area. Furthermore, metal layers in the bending area 110 are symmetrically disposed at two sides of the filling layer 102.

Figure 5:
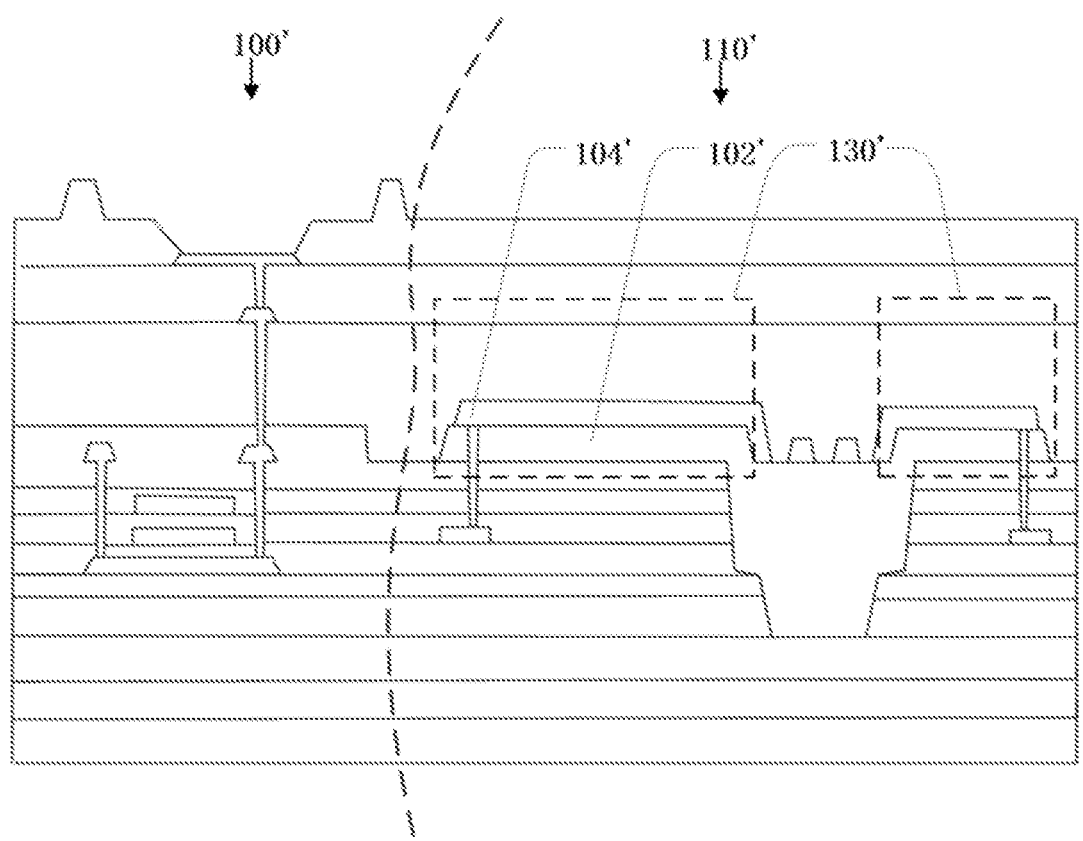
FIG. 5 is a schematic structural view showing a metal layer in a conventional TFT array substrate.
Figure 6:
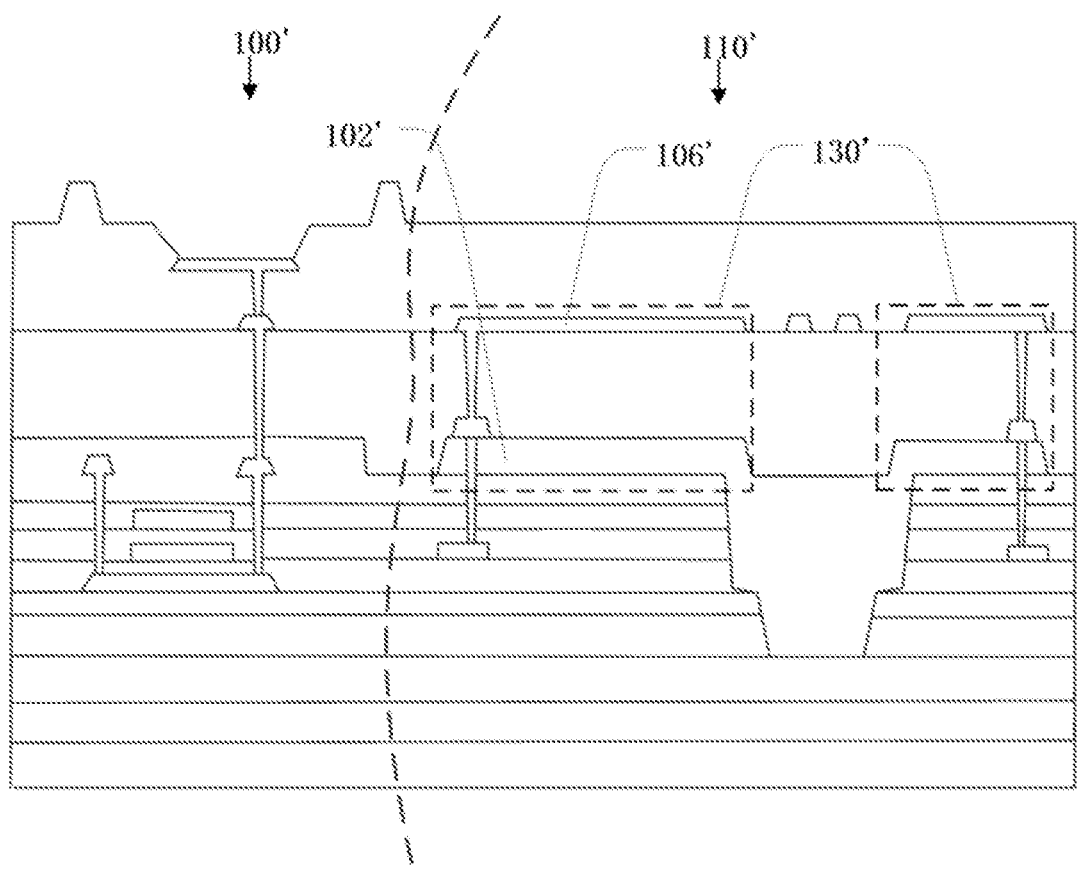
FIG. 6 is a schematic structural view showing a second layer in the conventional TFT array substrate in FIG. 5.
Figure 7:
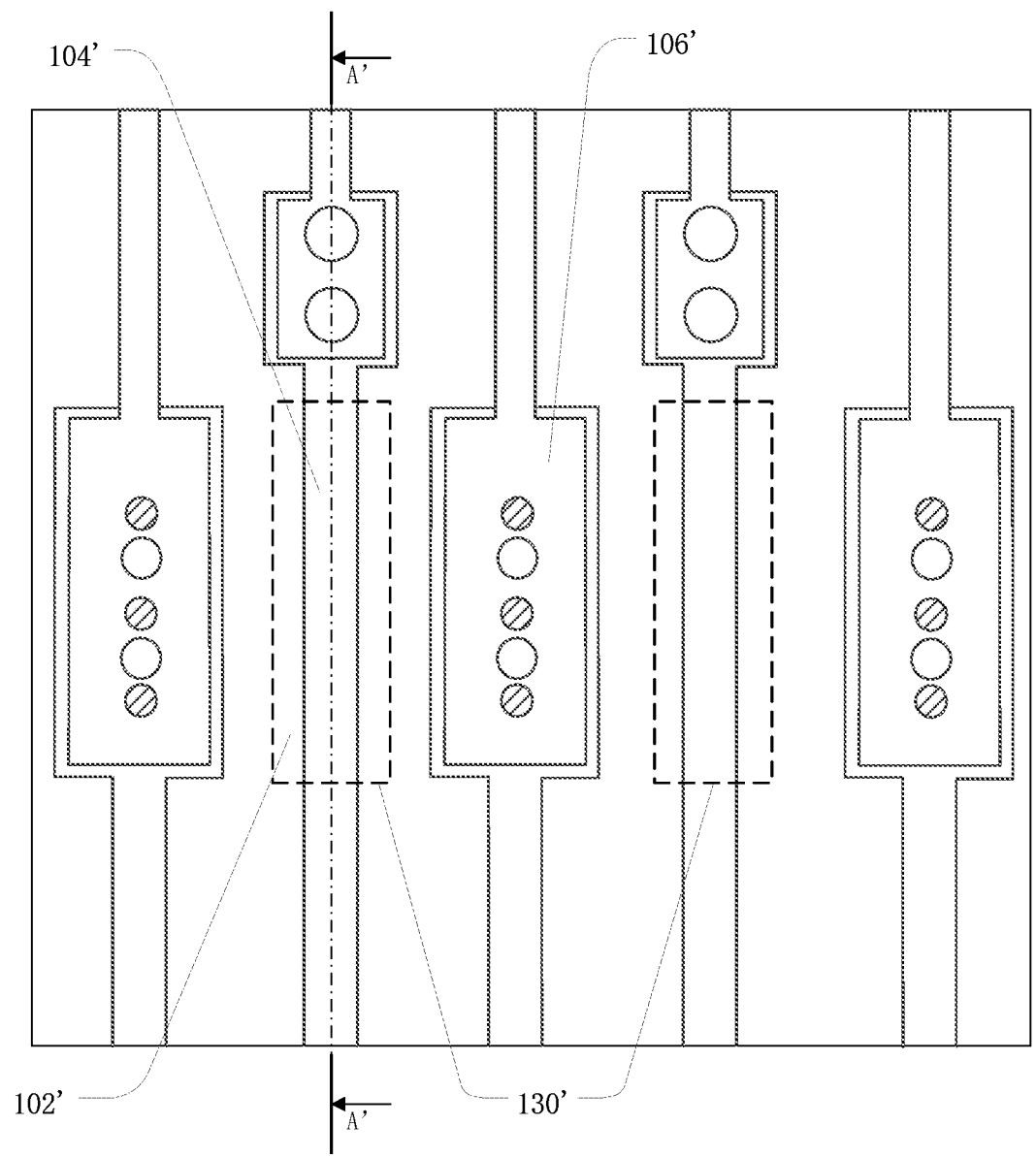
FIG. 7 is a structural plan view showing a bending area of the conventional TFT array substrate in FIG. 5.
Figure 8:
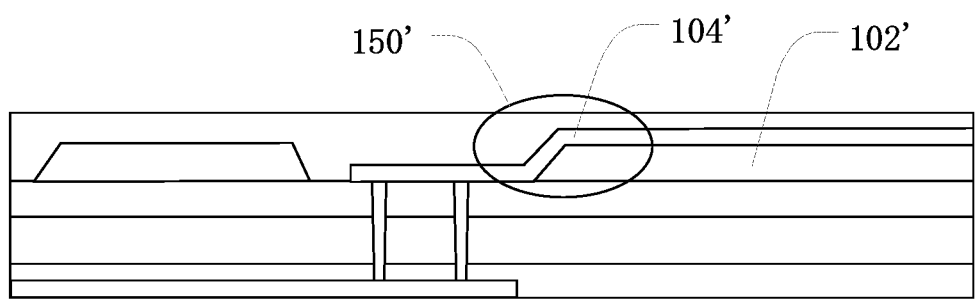
FIG. 8 is a sectional view taken along line A'-A' in FIG. 7.

By comparing positions of a first metal layer and a second metal layer of the present disclosure in FIG. 1 with positions of a first metal layer and a second metal layer of conventional technology in FIG. 5 and FIG. 6, it can be seen that a position of the first metal layer 1040 and a position of the second metal layer 1060 of the present disclosure are exchanged in the bending area. Specifically, a position of lines on the first metal layer 1040 and a position of lines on the second metal layer 1060 are exchanged. Because an interlayer is disposed between the first metal layer and the second metal layer, an opening is not defined beside lines of the first metal layer after positions of the two metal layers are exchanged. Therefore, a position between two filling openings will not protrude, thereby effectively reducing risks of breakage of lines because of over etch.

Furthermore, an embodiment of the present disclosure provides a display panel, including the above TFT array substrate.

The preferred embodiments are not intended to limit the present disclosure, and it is understood that many changes and modifications to the described embodiment can be carried out without departing from the scope and the spirit of the disclosure that is intended to be limited only by the appended claims.

What is claimed is:

1. A thin film transistor (TFT) array substrate provided with a display area and a bending area, comprising a substrate layer and a functional layer disposed on the substrate layer, wherein the functional layer comprises a plurality of insulating layers and a plurality of metal layers;
    wherein a deep hole is defined in the functional layer in the bending area, a filling layer is disposed in the deep hole, and a side end at top of the filling layer protrudes from a periphery of the deep hole;
    wherein in the bending area, the metal layers comprise a first metal layer, a second metal layer, and a second gate layer, and the insulating layers of the functional layer are disposed between the second gate layer, the first metal layer, and the second metal layer; and
    wherein the first metal layer is disposed on the side end of the filling layer and is connected to the second gate layer by a through hole, and the second metal layer is disposed on an insulating layer on an outer side of the first metal layer,
    wherein the metal layers in the bending area comprise a first gate layer, a gate insulating layer is disposed between the first gate layer and the second gate layer, and the insulating layers disposed between the second gate layer and the first metal layer constitute an interlayer dielectric layer,
    wherein the second metal layer is connected to the first gate layer by the through hole,
    wherein the first metal layer is not connected to the second metal layer.

2. The TFT array substrate of claim 1, wherein the insulating layers disposed between the first metal layer and the second metal layer constitute a first planarization layer, and the side end of the filling layer covers a portion of the interlayer dielectric layer.

3. The TFT array substrate of claim 1, wherein a transfer metal layer is disposed between the second metal layer and the first gate layer, the second metal layer is connected to the transfer metal layer by the through hole, and the transfer metal layer is connected to the first gate layer by the through hole.

4. The TFT array substrate of claim 1, wherein the functional layer in the bending area comprises a buffer layer, the buffer layer is disposed on the substrate layer, and the filling layer penetrates the buffer layer and enters the substrate layer.

5. The TFT array substrate of claim 4, wherein the substrate layer comprises a polyimide layer and a barrier layer disposed on the polyimide layer, and a bottom of the filling layer penetrates the barrier layer and reaches a surface of the polyimide layer.

6. The TFT array substrate of claim 1, wherein in the bending area, an insulating layer between the first metal layer and the second metal layer is a first planarization layer, and a second planarization layer covers the second metal layer.

7. A display panel, comprising the TFT array substrate of claim 1.

8. The display panel of claim 7, wherein the display panel is a flexible active-matrix organic light-emitting diode display panel.

* * * * *